United States Patent [19]
Kosugi et al.

[11] Patent Number: 5,623,108
[45] Date of Patent: Apr. 22, 1997

[54] METHOD AND SYSTEM FOR MEASURING THREE-DIMENSIONAL DISPLACEMENT

[75] Inventors: Masayuki Kosugi, Ibaraki; Akio Tamai, Chiba, both of Japan

[73] Assignees: Obayashi Corporation, Osaka; Agency of Industrial Science and Technology, Tokyo, both of Japan

[21] Appl. No.: 478,680

[22] Filed: Jun. 7, 1995

Related U.S. Application Data

[62] Division of Ser. No. 277,520, Jul. 19, 1994, Pat. No. 5,511,429.

[30] Foreign Application Priority Data

Dec. 8, 1993 [JP] Japan ................................ 5-308227
Mar. 14, 1994 [JP] Japan ................................ 6-42830

[51] Int. Cl.⁶ .................................................... G01N 21/01
[52] U.S. Cl. ........................................ 73/865.8; 356/373
[58] Field of Search ........................... 73/151, 784, 786, 73/865.8; 340/690; 33/DIG. 1, DIG. 21, 544; 356/373; 324/207.23; 348/94, 95

[56] References Cited

U.S. PATENT DOCUMENTS 4,942,539  7/1990  McGee et al. ................... 348/94
5,198,876  3/1993  Anezaki et al. ................... 348/95
5,301,003  4/1994  Ikeda ................................ 356/73

*Primary Examiner*—Robert Raevis
*Attorney, Agent, or Firm*—Wenderoth, Lind & Ponack

[57] ABSTRACT

A method for measuring three-dimensional displacement of a mass comprises the steps of providing a measuring object placed on the end surface of the mass, for reflecting at least a fraction of three-dimensional displacement of the mass, arranging a displacement measuring equipment for free displacement relative to the mass and in opposition to the measuring object, and measuring three-dimensional relative displacement of the mass by detecting relative displacement of sad displacement indicative means relative to the displacement measuring equipment by the latter. The method is implemented by a three-dimensional displacement measuring system comprises a measuring object placed on the end surface of the mass, for reflecting at least a fraction of three-dimensional displacement of the mass, a displacement measuring equipment arranged for free displacement relative to the mass and in opposition to the measuring object, for measuring three-dimensional relative displacement of the mass by detecting relative displacement of sad displacement indicative means relative to the displacement measuring equipment by the latter. The method and system is suitable for measuring displacement of a rock across a crack.

12 Claims, 7 Drawing Sheets

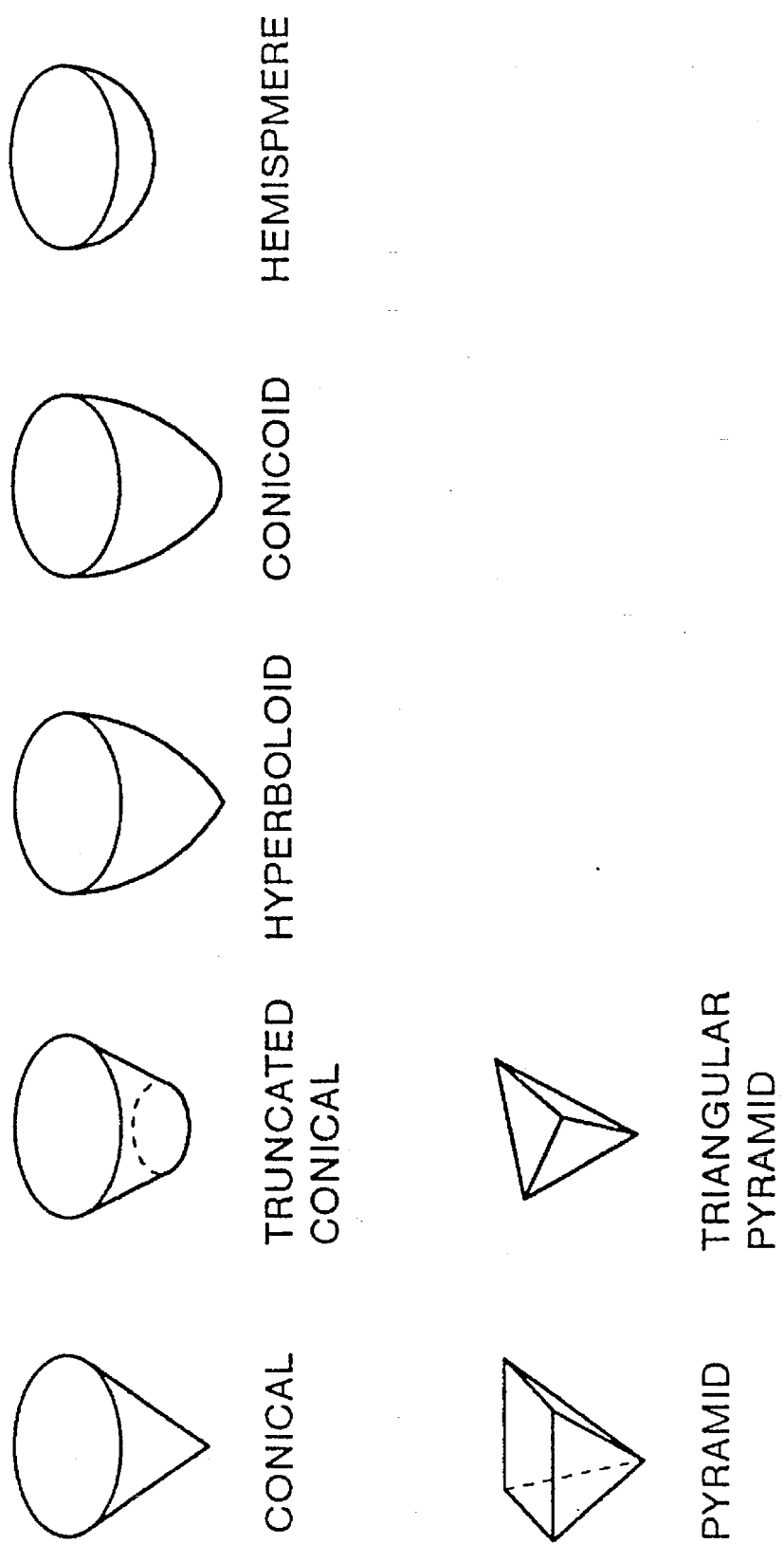

METHOD AND SYSTEM FOR MEASURING THREE-DIMENSIONAL DISPLACEMENT

This is a divisional application of Ser. No. 08/277,520 filed Jul. 19, 1994, and now U.S. Pat. No. 5,511,429.

BACKGROUND OF THE INVENTION

1. Field of the Invention

The present invention relates generally to a method and a system for measuring three-dimensional displacement of a mass. More specifically, the invention relates to a method and a system suitable for measuring three-dimensional displacement of a discontinuous surface, such as a crack in a rock or a natural joint and so forth.

2. Description of the Related Art

Conventionally, in fields of mechanical engineering, civil engineering and so forth, non-contact type distance measuring equipment, such as a laser type displacement gauge, or a contact type displacement gauge employing a differential transformer and so forth, are used practically. Namely, this measuring equipment performed high precision measurement of the displacement of a mass as an object of measurement (hereinafter referred to as a measuring object) as a relative displacement from a reference portion where various displacement gauges are placed.

Also, particularly in the field of civil engineering and mining, or in the field of geophysics, measurement of the displacement of a foundation, such as rock, is performed for appropriately evaluating behavior of rock or crust. As a method for measuring the displacement of the foundation, a measuring method employing an extensometer is typically employed. Namely, this method makes analysis of the displacement of the foundation by setting a fixed measuring point within a bore hole formed in the foundation, such as the rock, and measuring a variation of a distance between the fixed measuring point and a measuring point located at the opening end of the bore hole on the earth by means of the extensometer.

However, when the displacement of the mass is measured by the conventional measuring system and method, the relative displacement from the reference portion where the displacement gauge is located is merely measured as a linear relative displacement. Therefore, in order to measure the three dimensional displacement of the mass, displacement measurements are by means of a plurality of measuring apparatuses which are arranged three-dimensionally. This makes installation of the measuring apparatuses and collection of measured data complicated.

Furthermore, in particular where three-dimensional behavior of the foundation is to be evaluated by the extensometer, since the measuring method employing the extensometer permits only evaluation of relative linear displacement between two measuring points along an axis of the bore hole, it is inherent to three-dimensionally arrange a plurality of bore holes to perform multi-axes and multi-point measurement for three-dimensional evaluation. In addition, in the method, it is not possible to instantly detect the behavior of a discontinuous surface, such as a crack of the rock, a natural joint and so forth, which sensitively reflects variations of the stress condition of the foundation.

Namely, in the conventional method employing the extensometer, a problem is encountered by requiring a huge amount of experiments for performing multi-axis and multi-point measurement for evaluating the three-dimensional behavior of the foundation. Also, the conventional method cannot make analysis of the behavior by specifying the discontinuous surface, but rather unitarily evaluates deformation of the discontinuous surface associating with variation of the stress condition in the foundation and displacement of the foundation as a continuous body. Therefore, it is not possible to perform evaluation by specifying deformation of the discontinuous surface primarily determining deformation of the foundation. In the prior art, a further problem is encountered in the impossibility of proper evaluation of the relationship between the behavior of the overall foundation and the behavior of the discontinuous surface, deformation direction, and deformation magnitude.

SUMMARY OF THE INVENTION

The present invention has been worked out in view of the problems set forth above, and, therefore, it is an object of the present invention to provide a method and a system for measuring three-dimensional displacement which do not require displacement measurement with a three-dimensionally arranged plurality of measuring apparatuses and can easily measure three-dimensional displacement of a mass.

Another object of the present invention is to provide a three-dimensional displacement measuring system which can easily evaluate three-dimensional behavior of a foundation without requiring multi-axis and multi-point measurement and which permits high precision and effective evaluation of the deformation of the foundation by specifically measuring the deformation of a discontinuous surface primarily determining most of deformation of the foundation.

In order to accomplish the above-mentioned and other objects, a method for measuring three-dimensional displacement of a mass, according to one aspect of the present invention, comprises the steps of:

providing a displacement indicating means placed on an end surface of the mass for reflecting at least a fraction of three-dimensional displacement of the mass;

arranging a displacement measuring means for free displacement relative to the mass and in opposition to the displacement indicating means; and measuring three-dimensional relative displacement of the mass by detecting relative displacement of the displacement indicating means relative to the displacement measuring means by the latter.

In one embodiment in one aspect of the invention set forth above, the displacement indicating means may comprise a concave surface formed of a curved surface converging from the opening end to the bottom. On the other hand, the displacement measuring means may comprise displacement measuring equipment arranged in opposition to the concave surface and measuring the relative distance to the concave surface along a circumferential trace by rotating about a center axis of the concave while maintaining a given tilt angle relative to the center axis for circumferentially scanning the concave surface. Also, the method may include a step of analyzing the displacement of the circumferential trace on the concave surface associating with the displacement of the mass, on the basis of the relative distance measured by the displacement measuring equipment.

When the above-mentioned method is applied for measurement of the displacement of a rock, the mass may comprise a first cylindrical member arranged at one side of a discontinuous surface in a bore hole formed across the discontinuous surface, and the displacement measuring equipment may comprise a second cylindrical member positioned at the other side of the discontinuous surface, and the displacement measuring equipment measures displacement of the first cylindrical member opposing across the discontinuous surface relative to the second cylindrical member. The discontinuous surface may be a crack in the rock, and the displacement of the rock at the crack is detected by measuring displacement of the first cylindrical member relative to the second cylindrical member.

In another embodiment of one aspect of the invention, which is intended to be applied for measurement of the displacement of the rock, exclusively, the mass may comprise a first cylindrical member arranged at one side of a discontinuous surface in a bore hole formed across the discontinuous surface. The displacement indicating means may comprise at least three surface members mounted on the end surface of the first cylindrical member and respectively oriented in mutually perpendicular directions. The displacement measuring means may comprise at least three displacement measuring apparatuses arranged at the other side of the discontinuous surface in opposition to the three surface members respectively and directly detecting displacement of corresponding surface members. The discontinuity is a crack in a rock, and the displacement of the rock at the crack is detected by measuring displacement of the surface members.

The displacement measuring equipment may be mounted in a second cylindrical member positioned at the other side of the discontinuous surface. The method may further comprise the steps of a step of fixing the first and second cylindrical members on a guide means for restricting relative displacement between the first and second cylindrical members, a step of inserting an assembly of the first and second cylinder members fixed on the guide member into the bore hole and shifting the assembly within the bore hole for positioning the first cylindrical member at one side of the discontinuous surface and the second cylindrical member at the other side of the discontinuous surface, a step of releasing the first and second cylindrical members from the guide means and fixing them in the bore hole, and a step of removing the guide member from the bore hole.

According to another aspect of the invention, a three-dimensional displacement measuring system comprises:

a displacement indicating means placed on the end surface of the mass for reflecting at least a fraction of three-dimensional displacement of the mass;

a displacement measuring means arranged for free displacement relative to the mass and in opposition to the displacement indicating means for measuring three-dimensional relative displacement of the mass by detecting relative displacement of the displacement indicative means relative to the displacement measuring means by the latter.

In one embodiment of the second aspect of the invention, the displacement indicating means may comprise a concave surface formed of a curved surface converging from the opening end to the bottom. On the other hand, the displacement measuring means may comprise displacement measuring equipment arranged in opposition to the concave surface and measuring relative distance to the concave surface along a circumferential trace by rotating about a center axis of the concave while maintaining a given tilt angle relative to the center axis for circumferentially scanning the concave surface. The system may further comprise means for analyzing the displacement of the circumferential trace on the concave surface associated with the displacement of the mass on the basis of relative distance measured by the displacement measuring equipment.

The displacement measuring equipment may comprise non-contact type measuring equipment, which does not contact the concave surface. The non-contact type measuring equipment may be a laser displacement gauge radiating a laser beam oblique to the center axis of the concave surface, for example. The displacement measuring equipment may include a rotary table having a rotary shaft arranged in alignment with the center axis of the concave surface driven by a motor, the laser displacement gauge being mounted on the rotary table.

In another embodiment of the second aspect of the invention, the mass may comprise a first cylindrical member arranged at one side of a discontinuous surface in a bore hole formed across the discontinuous surface. The displacement indicating means may comprise at least three surface members mounted on the end surface of the first cylindrical member respectively oriented in mutually perpendicular directions. The displacement measuring means may comprise at least three displacement measuring apparatuses arranged at the other side of the discontinuous surface in opposition to the respective three surface members and directly detecting displacement of corresponding surface members.

The displacement measuring equipment may comprise at least one differential transformer displacement sensor contacting the surface member. In one example, the differential transformer displacement sensor comprises measuring elements to be constantly maintained in contact with the surface members and a differential transformer portion connected to the measuring elements.

Preferably, the displacement measuring equipment is mounted in a second cylindrical member positioned at the other side of the discontinuous surface. The first and second cylindrical members may have fixing means press fitted onto the peripheral wall surface of the bore hole for fixing the first and second cylindrical members within the bore hole. The fixing means may comprise a fixing rod slidably extending radially through each of the cylindrical members.

In the further preferred construction, the system may further comprise a guide means, on which the first and second cylindrical members are fixed by means of the fixing rod, and the first and second cylindrical members are guided in the bore hole in a position fixed on the guide means and restricted relative displacement to each other. Releasing and fixing of the cylindrical member is done by sliding the fixing rod.

Other objected, features and advantages of the present invention will become clear from the detailed description given hereinafter with reference to the accompanying drawings.

BRIEF DESCRIPTION OF THE DRAWINGS

The present invention will be understood more fully from the detailed description given herebelow and from the accompanying drawings of the preferred embodiment of the present invention, which, however, should not be taken to be limitative of the invention, but are for explanation and understanding only.

In the drawings:

FIG. 2 is an illustration showing an example of a curved plane forming a concave surface;

DESCRIPTION OF THE PREFERRED EMBODIMENT

The preferred embodiments of a three-dimensional displacement measuring system and method will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

Figure 1:
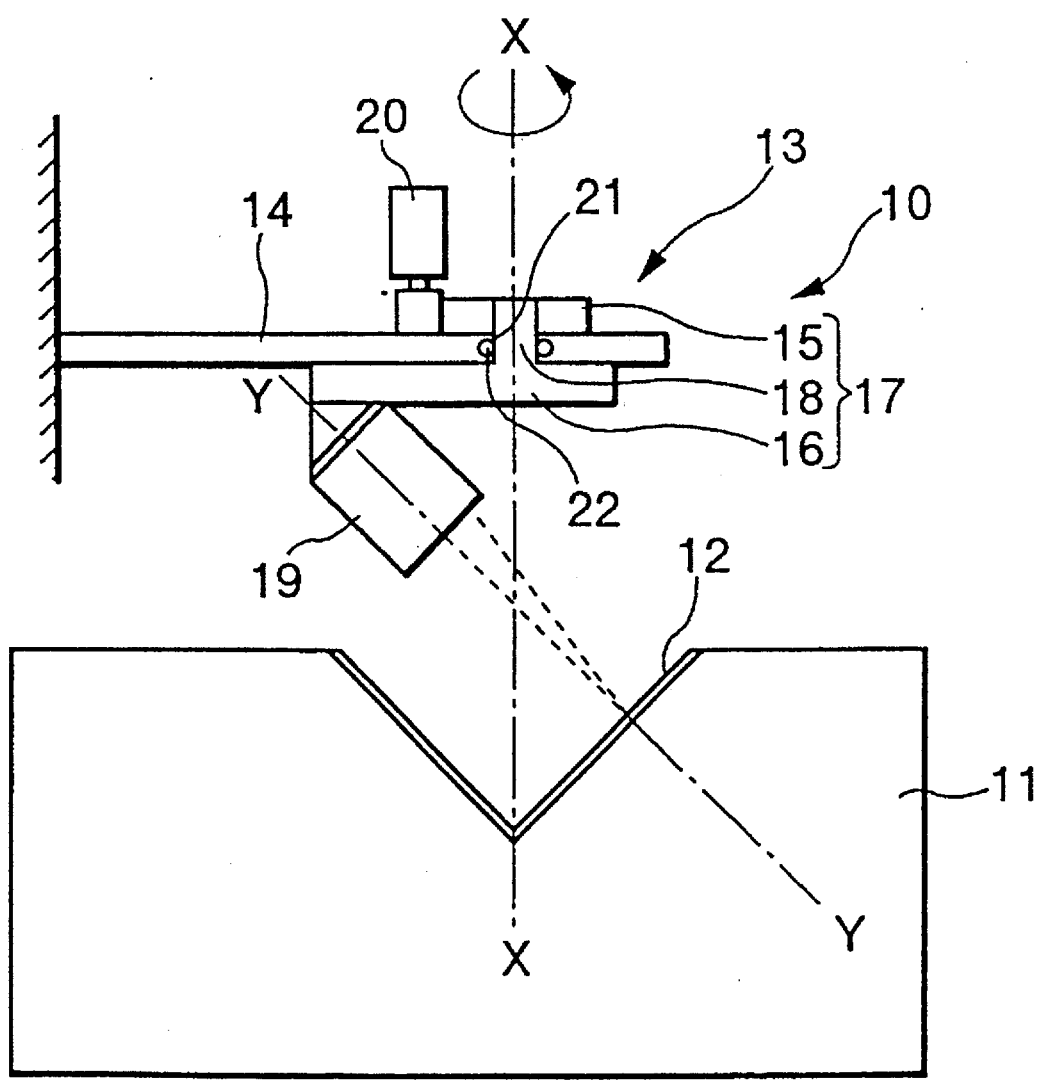
FIG. 1 is an explanatory illustration showing a manner of measuring three-dimensional displacement of a mass by means of one embodiment of a three-dimensional displacement measuring system according to the present invention.

FIG. 1 shows a manner of measurement of a three-dimensional displacement of a rigid block 11 as a measuring object, employing the first embodiment of a three-dimensional displacement measuring system 10 according to the present invention. The three-dimensional displacement measuring system 10 comprises a concave surface 12 formed on the rigid block 11, and a displacement measuring apparatus 13 provided above the opening portion of the concave surface 12 and supported by a stationary base 14 in opposition to the concave surface 12.

The concave surface 12 converges toward a bottom thereof from the opening portion and is formed of a curved surface expressed by a mathematical equation. For example, as shown in FIG. 2, the concave surface defines a configuration of a conical surface, truncated conical surface, hyperboloid, conicoid, hemisphere, pyramid, triangular pyramid or so forth. Also, the concave surface 12 is processed by surface finishing to provide a smooth surface so that distance measurement by means of a laser displacement gauge 19, which will be discussed later, can be performed accurately.

On the other hand, the displacement measuring apparatus 13 comprises an upper rotary disc 15 and a lower rotary disc 16 arranged at both sides of the stationary base 14 to form a rotary table 17 rotatable about a rotary shaft 18 positioned in alignment with a center axis X of the concave surface 12. The laser displacement gauge 19 is mounted on the lower rotary disc 16. The rotary table 17 is driven by a rotation control motor 20 by the upper rotary disc 15 engaging with the motor. The laser displacement gauge 19 is mounted in an orientation directed in a direction Y, which is oblique to the center axis X of the concave surface 12. By this arrangement, a laser beam radiated from the laser displacement gauge 19 impinges on the curved surface forming the concave surface 12, and is then reflected to return to the laser displacement gauge 19. By this, the relative distance between the laser displacement gauge and a reflection point can be determined. It should be noted that this type of laser displacement gauge is per se known in the art. According to rotation of the rotary table 17, the center axis of the laser displacement gauge 19, namely the radiation axis Y of the laser beam, is shifted in the circumferential direction to define a conical trace. On the other hand, the reflection point of the laser beam defines a circular trace on the concave surface 12 by rotatingly scanning the laser beam on the concave surface. The rotary shaft 18 of the rotary table 17 extends through a through hole 21 defined in the stationary base 14. A ball bearing 22 is disposed within the through hole 21 for permitting smooth rotation of the rotary table 17.

With the illustrated embodiment of the three-dimensional displacement measuring system 10, three-dimensional displacement, including back and forth displacement, left and right displacement, and rotational displacement of the rigid block 11 is measured. Namely, when displacement is caused in the rigid block 11, a trace of an intersection between the circumferentially shifting laser beam defining a conical trace and the concave surface 12 having a particular surface configuration, such as conical configuration surface, hyperboloid configuration surface and so forth, i.e. the trace of the reflection point of the laser beam, shifts three-dimensionally. The displacement of the trace of the laser beam reflection point on the concave surface 12 is analyzed according to the following principle for easily measuring the displacement of the rigid block 11 as a relative displacement from the displacement measuring equipment 13.

The principle of deriving the displacement of the rigid body 11 is as follows. Here, for the purpose of disclosure, the rotationally displacement of the rigid block will be ignored to simplify the disclosure. However, it is, of course, possible to perform with taking the rotational displacement of the rigid body into account.

Figure 3A:
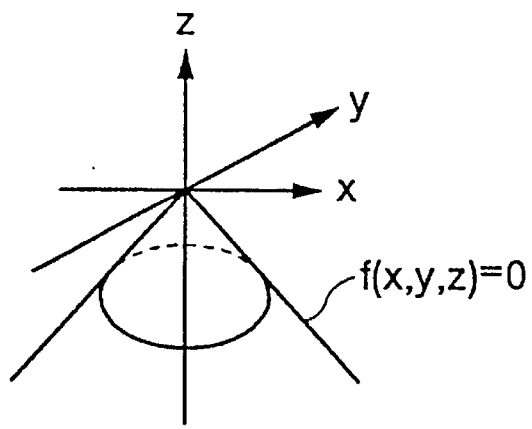
FIGS. 3(A) to 3(D) are illustrations explaining a principle of measurement of three-dimensional displacement of the mass by the present invention.

1) Assuming the trace defined by the irradiation axis Y of the last beam is expressed by an equation for conical configuration as follows:

$$f(x, y, z)=0 \qquad \text{(FIG. 3(A))}$$

Figure 3B:
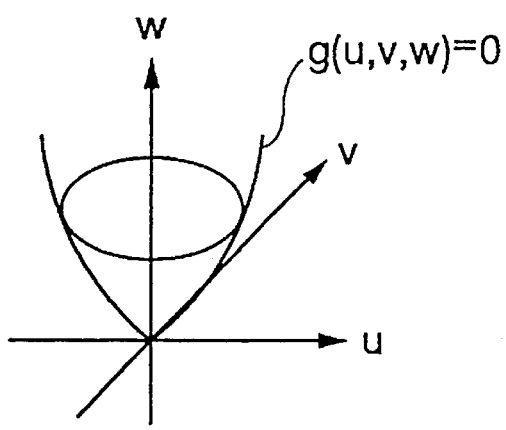
Figure 3C:
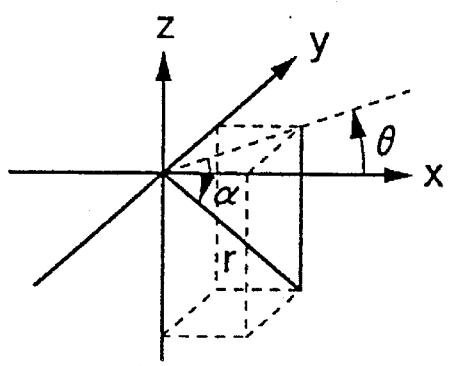
Figure 3D:
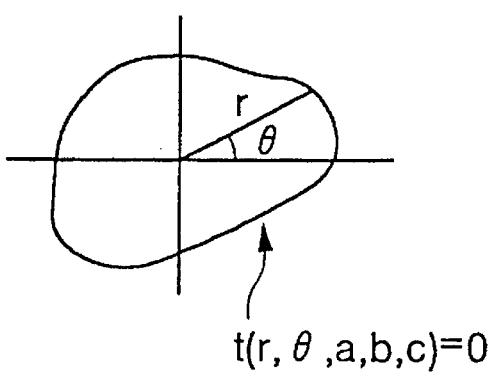

2) The equation of the concave surface 12 arranged in opposition to the laser displacement gauge is expressed by:

$$g(u, v, w)=0 \qquad \text{(FIG. 3(B))}$$

3) z axis is parallel to w axis.

Under the condition set forth above, a relationship of both coordinate axes can be expressed by:

$$x=u+a$$
$$y=v+b$$
$$z=w+c$$

(where a, b, c are offset in x direction, y direction and z direction of the coordinate center of (u, v, w).)

4) By this, the equation of the curve (this expresses the rotational trace of the reflection point) when two curved surfaces intersect is as follows:

$$f(x, y, z)=g(x-a, y-b, z-c)$$

Here, for the purpose of disclosure, it is assumed that (x, y, z, a, b, c)=0

5) Assuming that the length measured by the displacement gauge is 4 and the angle is θ, the relationship between the distance r, angle θ and (x, y, z) can be expressed as follows:

$$x = r \cdot \cos \alpha \cdot \cos \theta$$

$$y = r \cdot \cos \alpha \cdot \sin \theta$$

$$z = -r \cdot \sin \alpha$$

6) Accordingly, the trace defined on the concave surface 12 by the measured value (r and θ) can be expressed by:

$$h(r \cdot \cos \alpha \cdot \cos \theta, r \cdot \cos \alpha \cdot \sin \theta, -r \cdot \sin \alpha) = 0$$

Therefore, it can be expressed by:

$$t(r, \theta, a, b, c) = 0$$

7) From the measured trace, a, b, c satisfying the foregoing function may be derived by way of an optimization method, such as a method of least squares and so forth.

8) Since a, b, c can be derived in each measurement, the three dimensional displacement can be easily calculated by comparing a, b, c derived at respective measurements.

Figure 4:
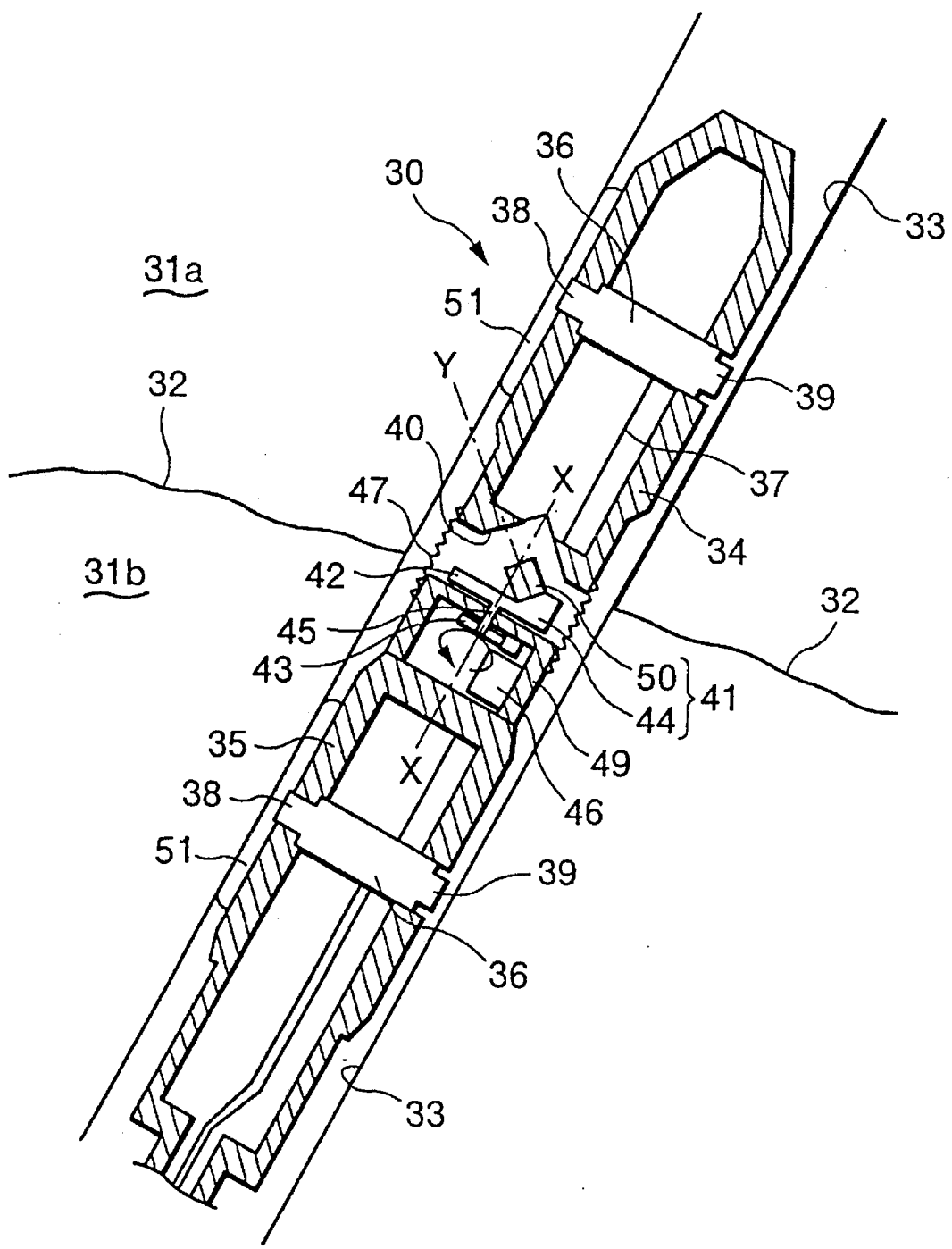
FIG. 4 is a fragmentary illustration showing another embodiment of the three-dimensional displacement measuring system according to the present invention, adapted for measurement of displacement of a discontinuous surface of a rock.

FIG. 4 shows another embodiment of a three-dimensional displacement measuring system 30 according to the present invention. The illustrated embodiment of the three-dimensional displacement measuring system 30 is intended to be employed in the evaluation of the behavior of a foundation. The three-dimensional displacement measuring system 30 is disposed within a bore hole 33 formed across a discontinuous surface, such as a crack 32 of the rock, and so forth. The three-dimensional displacement measuring system 30 includes a first cylindrical member 34 as a mass located in one side of the rock 31a and a second cylindrical member 35 located in the other rock 31b opposing the rock 31a across the crack 32 and following the first cylindrical member 34.

The first cylindrical member 34 defies a concave surface 40 formed with a predetermined curved surface, such as a conical surface, a truncated conical surface, hyperboloid, conicoid, hemisphere, pyramid, or triangular pyramid, converging from the opening end to the bottom, at the rear end thereof. In the vicinity of the center of the first cylindrical member 34, a radially extending fixing rod 36 is provided. The fixing rod 36 has an expanding and contracting device (not shown) constructed with a combination of a hydraulic cylinder and a spring. The expanding and contracting device is connected to a pressure line 37 to receive hydraulic pressure controllably supplied from a working base at the opening end of the bore hole 33 on the earth. The expanding and contracting device is responsive to the hydraulic pressure supplied through the pressure line 37 to drive a fixing pin 38 and a hole wall abutment 39 provided at both axial ends of the fixing rod 36 to cooperatively extend from or contract into the fixing rod. Namely, in operation, when the fixing pin 38 is driven toward the left to be protruded, the hole wall abutment 39 is driven to be retracted.

On the other hand, at the tip end of the second cylindrical member 35, displacement measuring equipment 41 is mounted in opposition to the concave surface 40 formed at the read end of the first cylindrical member 34. The displacement measuring equipment 41 comprises a rotary table 44 rotatably supported on a support frame 49 mounted on the tip end surface of the second cylindrical member 35, and a laser displacement gauge 50 fixed on the rotary table. The rotary table 44 has a front rotary disc 42 and a rear rotary disc 43 mutually coupled through a rotary shaft 45 extending in alignment with the center axis X of the concave surface 40. The rotary table 44 is rotatingly driven by a rotation control motor 46 engaging the rear rotary disc 43. The laser displacement gauge 50 is mounted on the front rotary disc 42 and oriented to direct the laser beam axis Y obliquely to the center axis X of the concave surface 40. The laser beam radiated from the laser displacement gauge 50 impinges on the curved surface forming the concave surface so as to be reflected therefrom. The laser beam axis Y is shifted according to rotation of the rotary table 44 while defining a substantially conical trace. Therefore, according to circumferential scanning of the laser beam on the concave surface 40, the reflecting point is shifted to form a circular trace. On the other hand, in the vicinity of the axial center position, a fixing rod 36 having an identical construction to that provided in the first cylindrical rod 34 is provided.

Within a gap between the first cylindrical member 34 and the second cylindrical member 35, a membrane wall 47, a water-tight seal member, is mounted surrounding the concave surface 40 and the displacement measuring equipment 41 for protecting the latter. Also, on the external surfaces of the first and second cylindrical members 34 and 35, a plurality of supporting legs 51 are arranged with a given interval in the circumferential direction at both circumferential sides of the fixing pins 38 of the rods 36. These supporting legs 51 cooperate with the hole wall abutments 39 of the fixing rod 36 when the hole wall abutments 39 are projected from the fixing rod to but against the hole wall so as to fix the first and second cylindrical members 34 and 35 at respective predetermined positions within the bore hole 33.

For analyzing the behavior of the crack 32 in the rock by the three-dimensional displacement measuring system 30, the three-dimensional displacement measuring system 30 is initially set in a predetermined position in the rocks 31a and 31b facing across the crack 32. Upon installation, the first and second cylindrical members 34 and 35 are integrally secured on a carriage having a sliding mechanism, such as wheels or casters. The first and second cylindrical members 34 and 35 are secured on the carriage by projecting the fixing pins 38 of the fixing rods 36 and engaging the fixing pins to the carriage. The first and second cylindrical members 34 and 35, with the carriages, are pushed into the bore hole 33 to place them at respective predetermined positions. Thereafter, hydraulic pressure is supplied to the expanding and contracting devices in the fixing rods 36 via the pressure lines 37 to force the hole wall abutments 39 to firmly abut the peripheral wall of the bore hole 33 to fix the first and second cylindrical members 34 and 35 at respective predetermined positions. It is preferred to mount a bore hole television camera on the carriage so as to facilitate acquisition of the crack 32. Furthermore, by using the bore hole television camera the first and second cylindrical members 34 and 35 may be accurately fixed at the predetermined positions. At the time of fixing the three-dimensional displacement measuring system 30 within the bore hole 33, the fixing pins 38 are driven to be retracted to release the first and second cylindrical members 34 and 35 from the carriage. Therefore, the carriage can be easily moved from the bore hole 33. It should be noted that installation of the measuring equipment at the predetermined positions will be described in a more concrete manner in another embodiment discussed later.

After installation of the three-dimensional displacement measuring system 30 at the predetermined positions, the relative displacement between the first cylindrical member 34 positioned within one of the rock 31a and the second cylindrical member 35 positioned within the other rock 31b is measured to analyze the specified crack 32. Namely, when the rocks facing across the crack are relatively displaced, the first and second cylindrical members 34 and 35 are similarly displaced relative to each other. Therefore, similarly to the embodiment of FIG. 1, the trace of the intersection between the laser beam axis Y, shifted to define a conical trace, and the concave surface 40, namely the circular trace of the reflection point, is displaced three-dimensionally. It should be appreciated that the three-dimensional displacement measuring system 30 is connected to a CPU (not shown) for performing measurement control, arithmetic operations, data file management and so forth, a data recording memory (not shown) and so forth via various connection lines so that analysis of the behavior of the crack 32 can be performed instantly. With the three-dimensional displacement measuring system 30 constructed as set forth above, by specifying the crack 32 which primarily determines most of deformation of the foundation as a discontinuous surface, the behavior of the crack can be easily analyzed with high precision to facilitate evaluation of the three-dimensional behavior of the foundation.

It should be noted that while the foregoing embodiments are discussed in terms of the use of the known laser type displacement gauge as the displacement gauge, it is possible to employ other non-contact type distance measuring apparatuses or a contact-type displacement gauge, such as that employing a differential transformer. When the contact type displacement gauge is used, it is desirable to provide a rotary ball or so forth at the tip end of the displacement gauge so that the displacement gauge may smoothly move on the concave surface 12 or 40 in the circumferential direction.

A further embodiment of the three-dimensional displacement measuring system according to the invention will be discussed with reference to FIGS. 5 to 7. The three-dimensional displacement measuring system 60 illustrated in these figures is designed for measuring displacement of the crack in the rock as one example of a discontinuous surface. The three-dimensional displacement measuring system 60 generally comprises a measuring object 61 disposed in the bore hole 33 formed in the rock across the crack 32 and located in the rock 31a positioned at one side of the crack 32, a displacement measuring apparatus 62 located within the rock 31b at the other side of the crack and following the measuring object 61, and a fixing guide member 63 detachably attached to the measuring object 61 and the displacement measuring apparatus 62.

Figure 6:
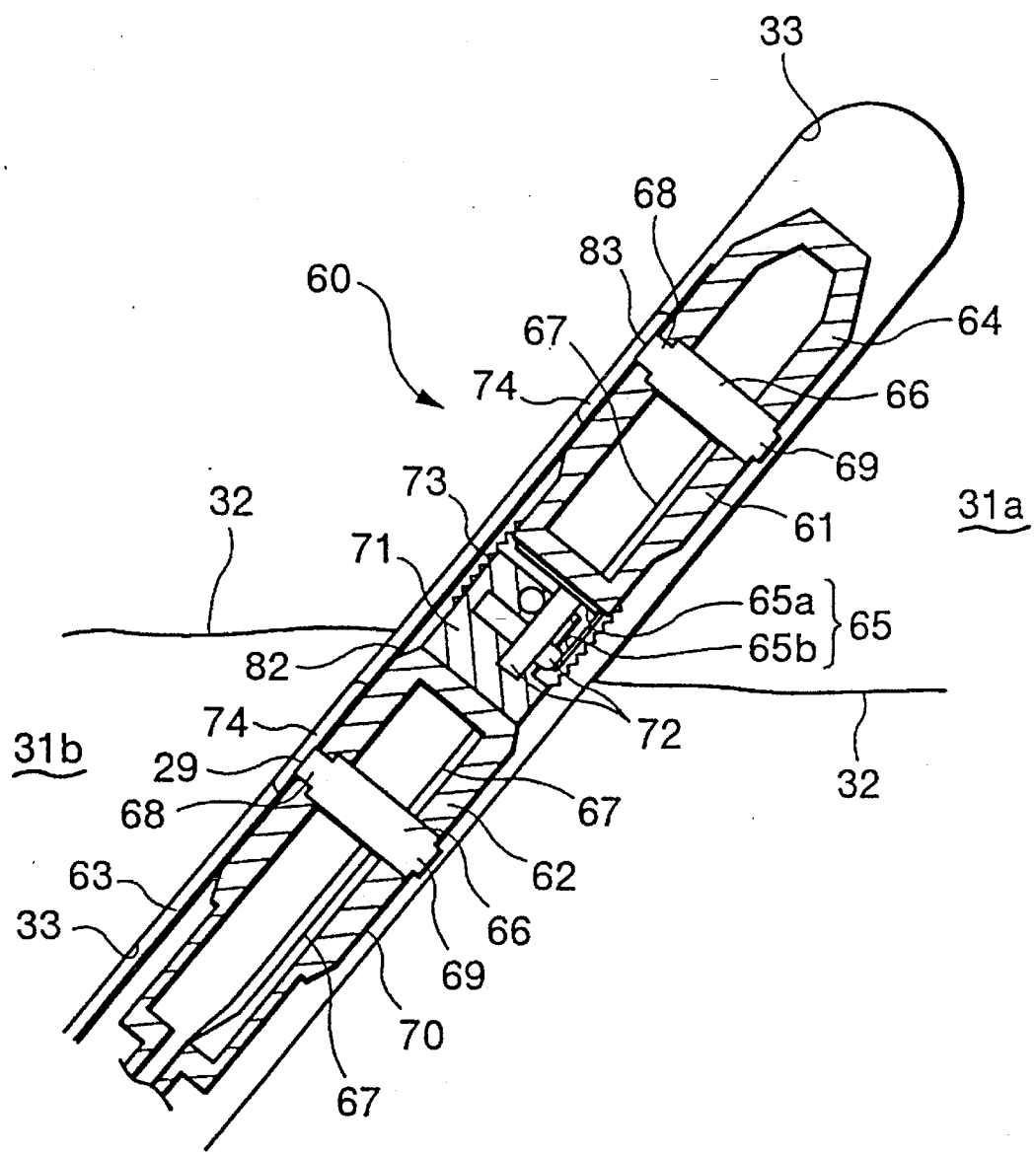
FIG. 6 is an enlarged view of a part of the three-dimensional displacement measuring system of FIG. 5.
Figure 7:
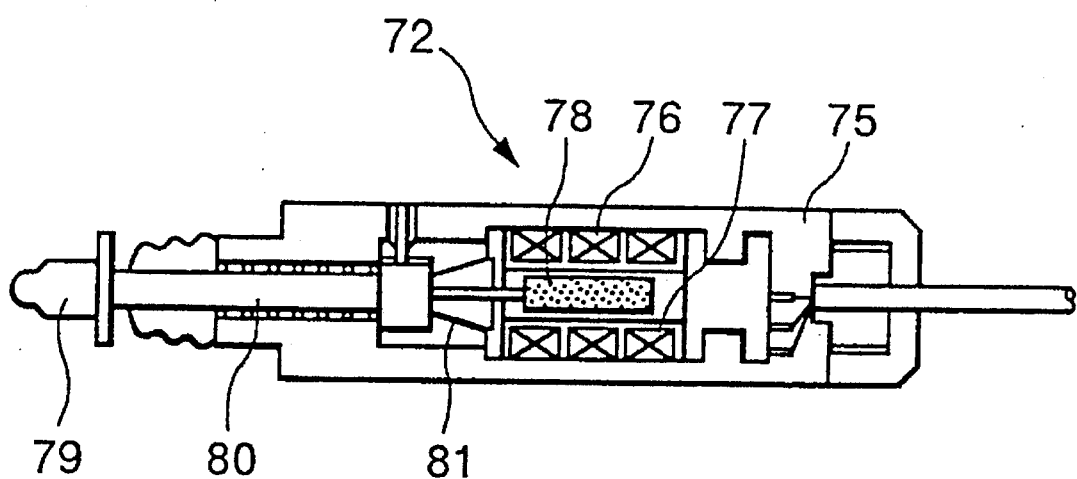
FIG. 7 is a section showing one example of a differential transformer displacement gauge in the three-dimensional displacement measuring system of FIG. 5.

As shown in enlarged section of FIG. 6, the measuring object 61 has a first cylindrical portion 64 having at tip end with a smaller diameter. On the read end surface of the first cylindrical member 64, a surface member 65a is mounted with the surface thereof oriented parallel to the rear end surface o the first cylindrical member. Another pair of surface members 65b (only one is shown) are oriented perpendicularly to the surface member 65a and extend rearwardly. The pair of surface members 65b also intersect perpendicularly to each other. The first cylindrical member 64 carries a fixing rod 66. The fixing rod 66 has an expanding and contracting device constructed with a combination of a hydraulic cylinder and a spring. The expanding and contracting device is connected to a pressure line 67 to receive a hydraulic pressure controllably supplied from a working base at the opening of the bore hole 63 on the earth. The expanding and contracting device is responsive to the hydraulic pressure supplied through the pressure line 67 to drive a fixing pin 68 and a hole wall abutment 69 provided at both axial ends of the fixing rod 66 to cooperatively extend from or contract into the fixing rod. Namely, in operation, when the fixing pin 68 is driven to the left to be protruded by the application of the hydraulic pressure, the hole wall abutment 69 is driven to be retracted. On the other hand, by releasing the hydraulic pressure, the fixing pin 68 is retracted and the hole wall abutment 69 is projected.

On the other hand, the displacement measuring equipment 62 has a second cylindrical member 70 following the first cylindrical members 64. On the tip end surface (the surface opposing the read end surface of the first cylindrical member 64 where the three surfaces 65, i.e. surfaces members 654a and 65b), a support base 71 is rigidly secured. On the support base 71, three differential transformer displacement sensors (hereinafter referred to as "LVDT displacement sensors) 72 are mounted. Each LVDT displacement sensor 72 is arranged to perpendicularly mate with a corresponding one of the three surfaces of the surface members 65a and 65b. The second cylindrical member 70 also includes a fixing rod 66 having an identical construction to that provided in the first cylindrical member 64. At a gap between the first and second cylindrical members 64 and 70, a membrane wall 73 serving as a water-tight seal is mounted, covering the three surface members 65 and the LVDT displacement sensor 72 for protruding the latter. On the external surface of the first and second cylindrical members 64 and 70, a plurality of supporting legs 74 are arranged with a given interval in the circumferential direction at both circumferential sides of the fixing pins 68 of the fixing rods 66. These supporting legs 74 are cooperative with the hole wall abutments 69 of the fixing rod 66 when the hole wall abutments 69 are projected from the fixing rod to abut against the hole wall, so as to fix the first and second cylindrical members 64 and 70 at respective predetermined positions within the bore hole 33.

The LVDT displacement sensor 72 is per se known in the art. For example, the LVDT displacement sensor 72 comprises a primary coil 76, a secondary coil 77, a differential transformer portion 75 including a core 78 formed of a magnetic body and disposed at the center of the primary and secondary coils, a measuring element 79, a spindle 80, a measuring pressure spring 81 and so forth. The measuring element 79 is held in contact with the surface members 65a and 65b of the three surfaces 65 and is adapted to be shifted in the axial direction according to displacement of the corresponding surface member. The magnitude of shifting of the measuring element 79 by exciting the primary side of the differential transformer portion 75 by an alternating current, generating a secondary signal proportional to the shifting magnitude of the measuring element 79, which is directly connected to the core 78 via the spindle 80, detecting the secondary signal to output it as a direct current signal indicative of the shifting magnitude of the measuring element 79, in turn indicative of the displacement of the three surfaces 65.

The fixing guide member 63 comprises a thin plate member 82 curved along the external surfaces of the first and second cylindrical members 64 and 70. The circumferential width of the plate member 82 is determined so that it may be placed between the support legs 74. For the plate member 82, engaging holes 83 for engaging with the fixing pins 68 of the fixing rods 66 are formed. Therefore, by projecting the fixing pins 68 to engage with the engaging holes 83, the measuring object 61 including the first cylindrical member 64 and the displacement measuring equipment 62 including the second cylindrical member 70 are fixed on the fixing guide member 63. In this condition, the measuring object 61 and the displacement measuring equipment 62 are fixedly connected to each other and thus prevented from relatively displacing. The support leg 84 maintains a clearance between the peripheral wall surface of the bore hole 33 and the external peripheries of the cylindrical members 64 and 70 for protecting the fixing guide member 63 and facilitating withdrawal of the fixing guide member 63.

Figure 5:
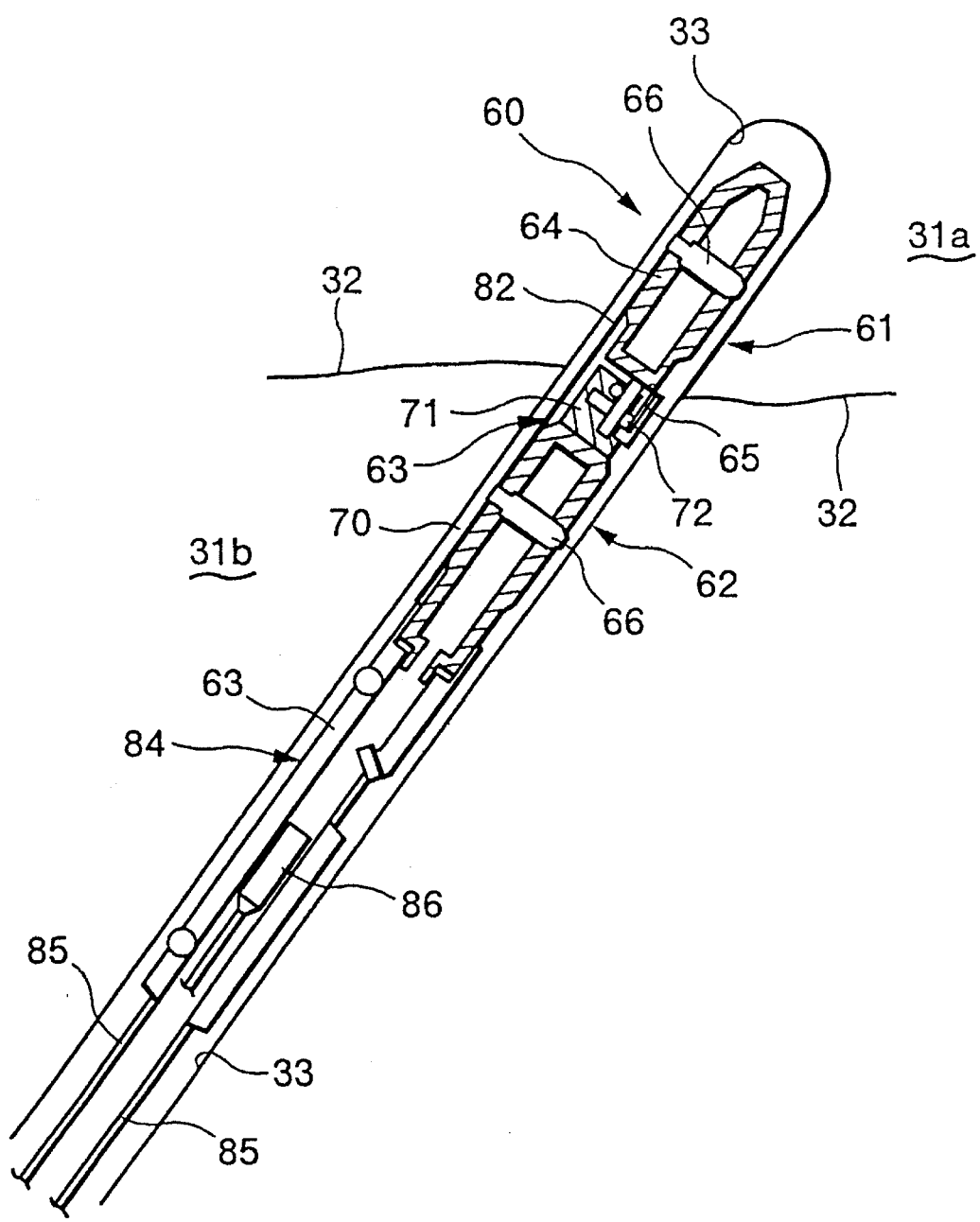
FIG. 5 is a section showing a further embodiment of the three-dimensional displacement measuring system according to the present invention, adapted for measurement of displacement of a discontinuous surface of a rock.

As shown in FIG. 5, as a supporting carriage is provided in the fixing guide member 63, a wheeled centrizer 84 is provided. The plate member 82 set forth above is extended frontwardly from the wheeled centrizer 84. An extension rod 85 reaching the opening end of the bore hole is connected to the wheeled centrizer 84. Also, the wheeled centrizer 84 carries a bore hole television camera 86 for visually monitoring the wall surface of the bore hole 33.

It should be noted that the LVDT sensor 72 of the displacement measuring equipment 62 is connected to an amplifier of the LVDT displacement sensor, an A/D converter, a CPU for performing measuring control and data file management, a data memory and so forth via various connection lines.

For measuring the displacement of the crack 32 in the rock employing the three-dimensional displacement measuring system 60 as set forth above, the three-dimensional displacement measuring system 60 is disposed within the bore hole 33 across the crack 32. The installation of the three-dimensional displacement measuring system is performed through the following process. The measuring object 61 and the displacement measuring equipment 62 are inserted into the bore hole 33 in a condition fixed to each other by the fixing guide member 63. By connecting extension rods 85, the assembly of the measuring object 61 and the displacement measuring equipment 62 are pushed to the predetermined positions in the bore hole 33 with sliding of the fixing guide member 63. Since the fixing guide member 63 includes the wheeled centrizer 84, the assembly of the measuring object 61 and the displacement measuring equipment 62 with the fixing guide member 63 can be smoothly moved within the bore hole 33. During movement of the assembly of the measuring object 61 and the displacement measuring equipment 62, the bore hole television camera 86 picks up the image of the peripheral wall of the bore hole 33 for visual display, and the accurate position of the crack 32 can be detected.

Once the accurate position of the crack 32 is detected by means of the bore hole television camera 86, the fixing guide member 63 is pulled back a predetermined stroke. Then, the positions of the measuring object 61 within the rock 31a at one side of the crack 32 and the displacement measuring equipment 62 within the rock 31b at the other side of the crack 32 are adjusted to place them at respective predetermined positions. Thereafter, the hydraulic pressure applied to the expanding and contracting device of the fixing rod 66 is drained so that the spring therein overcomes the hydraulic force to retract the fixing pins 68 away from the engaging holes 83 and, at the same time, protrude the hole wall abutment 69 to establish pressure contact thereon. Accordingly, the engagement between the fixing pins 68 and the engaging holes 83 is released to place the measuring object 61 and the displacement measuring equipment 62 in a state free from the fixing guide member 63. Simultaneously, abutment of the hole wall abutment onto the peripheral wall surface of the bore hole 33 in cooperation with the supporting legs 74 causes the measuring object 61 and the displacement measuring equipment 62 to be rigidly fixed at the respective predetermined positions in the bore hole 33. Installation of the three-dimensional displacement measuring system 60 is thus completed.

Attention should be paid to the fact that the measuring object 61 and the displacement measuring equipment 62 are held in the fixed position on the fixing guide member 63 until the three-dimensional displacement measuring system 60 is set in the bore hole 33. In this manner, the relative position between the measuring object 61 and the displacement measuring equipment 62 are maintained in a fixed condition. Thus a narrowing of the measuring range, an offset out of the measuring range and an error in measurement of the LVDT displacement sensor 82 due to offset of the initial fixing position can be successfully avoided.

The fixing guide member 63 which is released from the measuring object 61 and the displacement measuring equipment 62 upon fixing in the bore hole 33 is removed together with the bore hole television camera 86 via the extension rod 85.

When the rock 31a displaces relative to the rock 31b mating across the crack 32, the measuring object 61 also displaces relative to the displacement measuring equipment 62. This relative displacement appears as a displacement of any one or more of the three surfaces 65 of the surface members 65a and 65b to cause shifting of the corresponding measuring element or elements 79. Thus, by monitoring displacement of the three surfaces 65 by the three LVDT displacement sensors 72, the relative displacement of the foundation positioned across the crack 32 can be monitored with high precision. As set forth above, the LVDT displacement sensors 72 of the displacement measuring equipment 62 are connected to the amplifiers of the LVDT displacement sensors 72, the A/D converter, the CPU performing measurement control and data file management, the data recording memory and so forth. Therefore, the behavior of the crack can be monitored automatically for a long period.

It should be noted that when a predetermined period has elapsed and measurement is completed, the hole wall abutments 69 are released from engagement with the peripheral wall of the bore hole. Then, the three-dimensional displacement measuring system 60 can be recovered from the bore hole via the pressure line 67. Here, when the step is formed in the bore hole 33 due to deformation of the rocks, the displacement measuring equipment 62 may be separated from the measuring object 61 so that it may solely be recovered.

It should be noted that although the illustrated embodiment employs three mutually perpendicularly intersecting surfaces for monitoring three-dimensional behavior of the crack 32, it is naturally possible to employ more surfaces for measuring displacement.

Although the invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A method for measuring three-dimensional displacement of a mass, comprising the steps of:

placing a displacement indicating means on an end surface of the mass for reflecting at least a fraction of three-dimensional displacement of the mass;

arranging a displacement measuring means opposite to the displacement indicating means for free displacement relative to the mass; and measuring relative three-dimensional displacement of the mass by detecting displacement of the displacement indicating means relative to the displacement measuring means with the displacement measuring means;

the displacement indicating means comprising a concave surface having an open end and a bottom, the concave surface comprising a curved surface converging from the open end to the bottom.

2. A method as set forth in claim 1, wherein the displacement measuring means comprises a displacement measuring apparatus arranged opposite to the concave surface and said step of measuring further comprises measuring the relative distance to the concave surface along a circumferential trace by rotating about a center axis of the concave surface while maintaining a given tilt angle relative to the center axis so as to circumferentially scan the concave surface.

3. A method as set forth in claim 2, which further comprises a step of analyzing the displacement of the circumferential trace on the concave surface that is associated with the displacement of the mass, on the basis of the relative distance measured by the displacement measuring apparatus.

4. A method as set forth in claim 3, wherein the mass comprises a first cylindrical member arranged at one side of a discontinuous surface of a bore hole, the bore hole being formed across the discontinuous surface, and the displacement measuring apparatus comprises a second cylindrical member positioned at the other side of the discontinuous surface, and said step of measuring further comprises measuring displacement of the first cylindrical member relative to the second cylindrical member across the discontinuous surface.

5. A three-dimensional displacement measuring system, comprising:

a displacement indicating means placed on an end surface of a mass for reflecting at least a fraction of three-dimensional displacement of the mass; and a displacement measuring means, arranged for three displacement relative to the mass and opposite to the displacement indicating means, for measuring relative three-dimensional displacement of the mass by detecting displacement of said displacement indicating means relative to said displacement measuring means with said displacement measuring means;

wherein said displacement indicating means comprises a concave surface having an open end and a bottom, said concave surface comprising a curved surface converging from said open end to said bottom.

6. A system as set forth in claim 5, wherein said displacement measuring means comprises a displacement measuring apparatus arranged opposite to said concave surface for measuring the relative distance to said concave surface along a circumferential trace by rotating about a center axis of said concave surface while maintaining a given tilt angle relative to said center axis for circumferentially scanning said concave surface.

7. A system as set forth in claim 6, which further comprises means for analyzing the displacement of said circumferential trace on said concave surface that is associated with the displacement of said mass on the basis of the relative distance measured by said displacement measuring apparatus.

8. A system as set forth in claim 7, wherein said displacement measuring apparatus comprises non-contact measuring equipment that does not contact said concave surface in operation.

9. A system as set forth in claim 8, wherein said non-contact measuring equipment comprises a laser displacement gauge for radiating a laser beam obliquely to the center axis of said concave surface.

10. A system as set forth in claim 9, wherein said displacement measuring apparatus comprises a rotary table having a rotary shaft in alignment with the center axis of said concave surface, said rotary table being driven by a motor, and said laser displacement gauge being mounted on said rotary table.

11. A system as set forth in claim 8, wherein said mass comprises a first cylindrical member arranged at one side of a discontinuous surface in a bore hole, the bore hole being formed across the discontinuous surface, and said displacement measuring apparatus comprising a second cylindrical member positioned at the other side of said discontinuous surface.

12. A system as set forth in claim 11, wherein said first and second cylindrical members each comprises supporting legs and fixing rods that are adapted to be press fitted to the inner periphery of the bore hole.

* * * * *